US008004595B2

(12) United States Patent
Onozawa (10) Patent No.: US 8,004,595 B2
(45) Date of Patent: Aug. 23, 2011

(54) SOLID-STATE IMAGING DEVICE WITH A TWO-DIMENSIONAL ARRAY OF UNIT PIXELS

(75) Inventor: Kazutoshi Onozawa, Osaka (JP)

(73) Assignee: Panasonic Corporation, Osaka (JP)

( * ) Notice: Subject to any disclaimer, the term of this patent is extended or adjusted under 35 U.S.C. 154(b) by 397 days.

(21) Appl. No.: 12/275,492

(22) Filed: Nov. 21, 2008

(65) Prior Publication Data

US 2009/0141153 A1    Jun. 4, 2009

(30) Foreign Application Priority Data

Nov. 29, 2007    (JP) ................................. 2007-309448

(51) Int. Cl.
*G02B 13/16* (2006.01)
*H04N 5/225* (2006.01)
(52) U.S. Cl. ........................ 348/335; 348/273; 348/294
(58) Field of Classification Search .................. 348/335, 348/340, 273, 294; 250/208.1
See application file for complete search history.

(56) References Cited

U.S. PATENT DOCUMENTS

| | | | |
|---|---|---|---|
| 7,718,949 B2* | 5/2010 | Toshikiyo | ................... 348/340 |
| 2006/0284052 A1 | 12/2006 | Toshikiyo et al. | |
| 2006/0285228 A1 | 12/2006 | Ishii et al. | |
| 2007/0035721 A1 | 2/2007 | Toshikiyo et al. | |
| 2007/0146531 A1 | 6/2007 | Toshikiyo | |
| 2007/0164329 A1 | 7/2007 | Toshikiyo | |
| 2007/0200946 A1* | 8/2007 | Onozawa et al. | ............. 348/340 |
| 2008/0011937 A1 | 1/2008 | Toshikiyo | |
| 2008/0076039 A1 | 3/2008 | Ishii et al. | |
| 2008/0106804 A1* | 5/2008 | Ieda et al. | ................... 359/708 |
| 2008/0185500 A1* | 8/2008 | Toshikiyo | ................. 250/208.1 |
| 2008/0251873 A1 | 10/2008 | Kasano et al. | |

FOREIGN PATENT DOCUMENTS

WO    2005/101067 A1    10/2005

* cited by examiner

*Primary Examiner* — Gevell Selby
(74) *Attorney, Agent, or Firm* — Greenblum & Bernstein P.L.C.

(57) ABSTRACT

To provide a solid-state imaging device that can capture an image which is bright through to its periphery, even when used in a single-lens reflex digital camera that accepts various interchangeable lenses from wide-angle to telephoto. The solid-state imaging device includes a two-dimensional array of unit pixels each of which includes a light-collecting element. A light-collecting element in a unit pixel is a combination of circular-sector-shaped light-collecting elements having different concentric structures. A central axis of the concentric structures is perpendicular to a light-receiving plane of the light-collecting element. Each of the circular-sector-shaped light-collecting elements is divided into concentric zone areas of a width equal to or smaller than a wavelength of incident light. Thus, an image which is bright through to its periphery can be captured even when light incident on a unit pixel changes from wide-angle to telecentric (chief rays are approximately parallel to an optical axis).

3 Claims, 11 Drawing Sheets

Imaging area central part
Imaging area intermediate part
Imaging area peripheral part

FIG. 7B

Imaging area central part
Imaging area intermediate part
Imaging area peripheral part

FIG. 7C

Imaging area central part
Imaging area intermediate part
Imaging area peripheral part

Imaging area central part     Imaging area intermediate part     Imaging area peripheral part

FIG. 9B

Imaging area central part     Imaging area intermediate part     Imaging area peripheral part

FIG. 9C

Imaging area central part     Imaging area intermediate part     Imaging area peripheral part

SOLID-STATE IMAGING DEVICE WITH A TWO-DIMENSIONAL ARRAY OF UNIT PIXELS

BACKGROUND OF THE INVENTION (1) Field of the Invention

The present invention relates to a solid-state imaging device used for a digital camera and the like, and especially relates to a solid-state imaging device used for a single-lens reflex digital camera that accepts interchangeable lenses.

(2) Description of the Related Art

In recent years, the market for solid-state imaging devices has expanded remarkably with the spread of digital cameras, camera-equipped mobile phones, and the like. Moreover, single-lens reflex digital cameras that accept various interchangeable lenses from wide-angle to telephoto have become widely available. Meanwhile, there remains a strong demand for slimmer models of digital cameras and the like. A slimmer model means a lens used for a camera part has a short focal length, and light incident on a solid-state imaging device has a wide angle (that is, an angle of incident light measured with respect to an axis perpendicular to an incidence plane of the solid-state imaging device is large).

A solid-state imaging device such as a CCD or MOS image sensor has a two-dimensional array of semiconductor integrated circuits (unit pixels) that each include a light-receiving element, and converts light representing a subject into an electric signal. Since a sensitivity of such a solid-state imaging device is determined by a magnitude of an output current of the light-receiving element in response to an amount of incident light, for a higher sensitivity it is important to ensure that the incident light completely reaches the light-receiving element.

Figure 1:
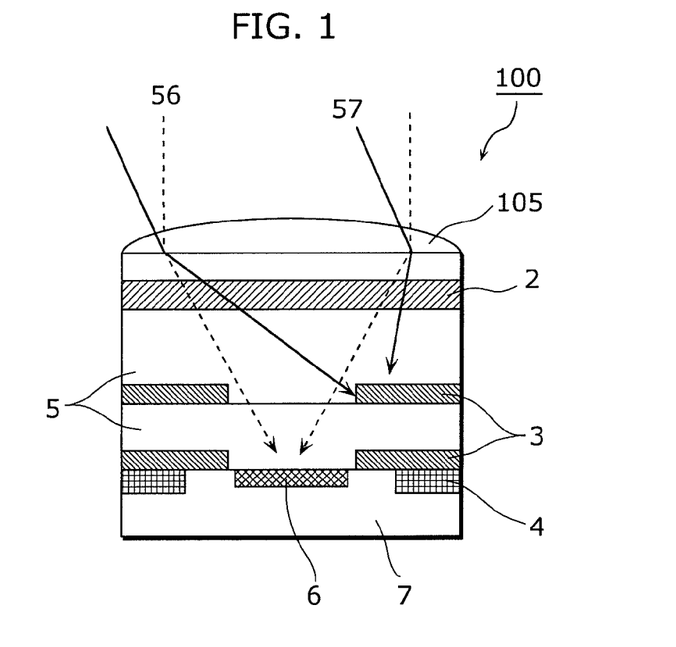
FIG. 1 shows an example of a basic structure of a conventional solid-state imaging device.

FIG. 1 shows an example of a basic structure of a conventional typical unit pixel 100. As shown in FIG. 1, light (incident light 56 shown by broken lines) vertically incident on a microlens 105 is separated in color by a color filter 2 of any of red (R), green (G), and blue (B), and then converted to an electric signal by a light-receiving element 6. The microlens 105 is used in most solid-state imaging devices, as it contributes to a relatively high light collection efficiency.

Figure 2:
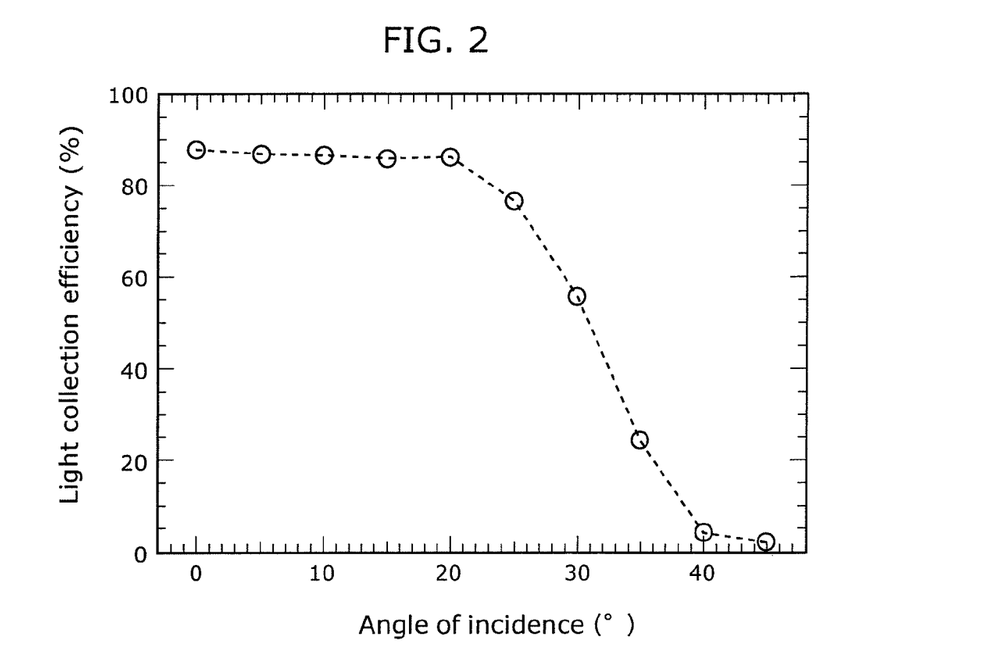
FIG. 2 shows angle-of-incidence dependence of light collection efficiency of a conventional solid-state imaging device using a microlens.

However, when the microlens 105 is used, the light collection efficiency decreases depending on an angle of incidence of signal light. In detail, the vertically incident light (incident light 56 shown by broken lines) on the lens can be collected with a high efficiency, but the light collection efficiency decreases for obliquely incident light (incident light 57 shown by solid lines), as shown in FIG. 2. This is because the obliquely incident light 57 is blocked by an Al wiring layer 3 in the pixel and as a result cannot reach the light-receiving element 6.

As mentioned above, a solid-state imaging device is composed of a two-dimensional array of unit pixels. Accordingly, when incident light has a spread angle, an angle of incidence differs between a central unit pixel and a peripheral unit pixel. This causes a problem of a decrease in light collection efficiency of the peripheral unit pixel as compared with the central unit pixel.

Figure 3:
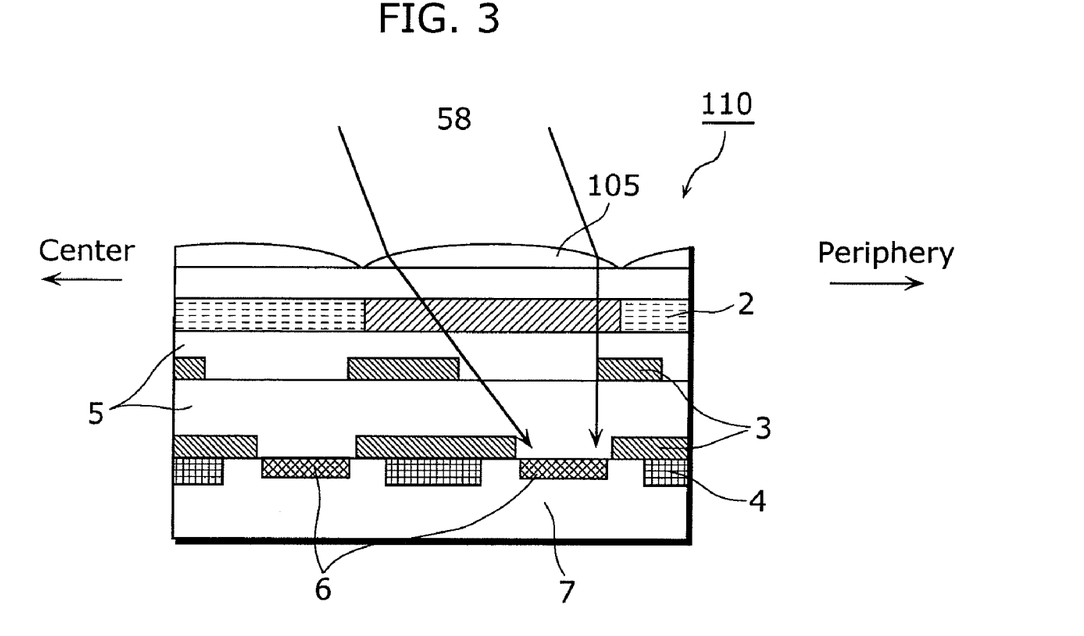
FIG. 3 shows an example of a structure of a peripheral unit pixel in a conventional solid-state imaging device.

FIG. 3 shows an example of a structure of a peripheral unit pixel in a conventional solid-state imaging device 110. Since incident light 58 has a large angle of incidence in the peripheral unit pixel, the Al wiring layer 3 and the light-receiving element 6 are shifted (shrunk) outwardly (toward the periphery) in order to improve the light collection efficiency.

FIG. 2 shows the angle-of-incidence dependence of the light collection efficiency of the conventional solid-state imaging device 110 using the microlens 105. As shown in FIG. 2, though incident light can be collected with a high efficiency when the angle of incidence is about 20° or less, the light collection efficiency drops significantly when the angle of incidence is larger. That is, an amount of light of a peripheral unit pixel is about 40% of that of a central unit pixel in the conventional solid-state imaging device 110, and an overall sensitivity of the solid-state imaging device 110 is limited by a sensitivity of the peripheral unit pixel. Besides, the overall sensitivity of the solid-state imaging device 110 further decreases with a decrease in pixel size, making it extremely difficult to apply to an optical system with a short focal length such as a small-size digital camera. Furthermore, it is impossible to perform a more circuit shrinkage than the present level in a manufacturing process.

To solve the above problems relating to wide-angle incident light, a solid-state imaging device that realizes a gradient index lens with an effective refractive index by forming a fine structure equal to or smaller than a wavelength of incident light has been proposed (for example, see pamphlet of International Patent Publication WO 05/101067, hereafter referred to as Patent Reference 1). In more detail, in a central part of an imaging area in the solid-state imaging device, a gradient index lens having an effective refractive index distribution that is symmetrical about a center of a corresponding unit pixel is formed by a combination of a plurality of concentric zone areas obtained as a result of dividing by a line width equal to or smaller than the incident light wavelength. In a peripheral part of the imaging area in the solid-state imaging device, on the other hand, a gradient index lens having an effective refractive index distribution that is asymmetrical about a center of a corresponding unit pixel is formed by a combination of a plurality of concentric zone areas obtained as a result of dividing by a line width equal to or smaller than the incident light wavelength, with a center of the concentric zone areas being displaced (offset) from the center of the unit pixel. According to this technique, even when light is obliquely incident on the imaging area peripheral part in the solid-state imaging device at a large angle with respect to an axis perpendicular to an incidence plane, the incident light can be collected at a light-receiving element, with it being possible to achieve a same level of sensitivity as in the imaging area central part in the solid-state imaging device.

Figure 4:
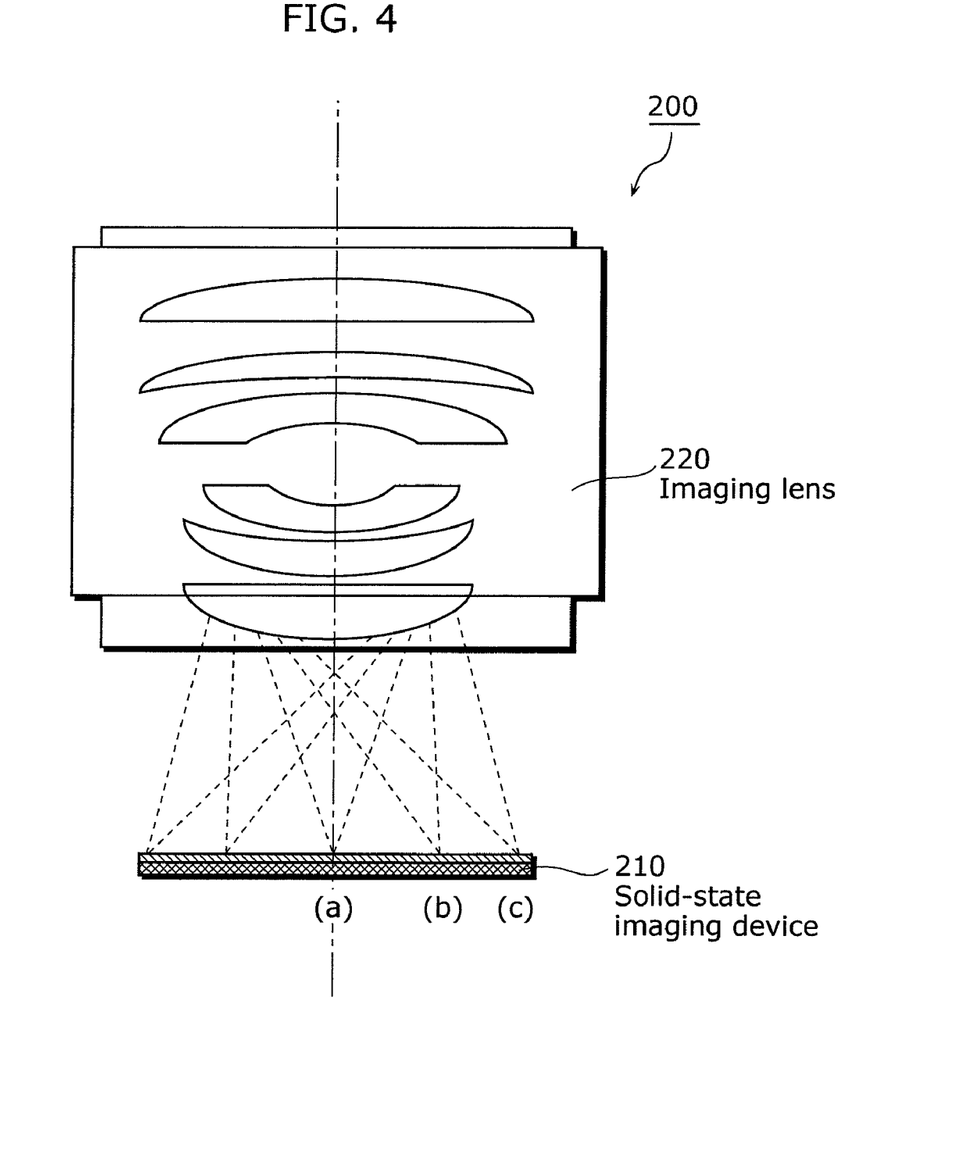
FIG. 4 shows a situation where light from an imaging lens is incident on a solid-state imaging device at a wide angle.
Figure 5A:
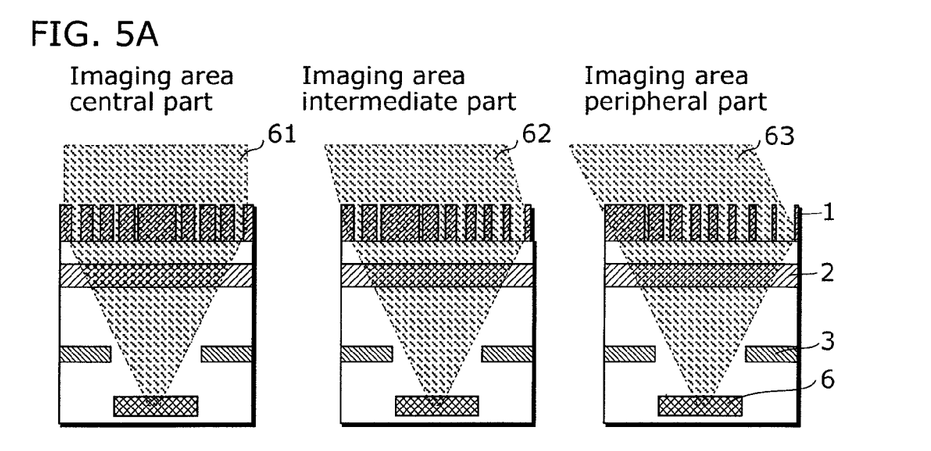
FIG. 5A is a sectional view showing an example of a basic structure of a unit pixel in each part of an imaging area in a conventional solid-state imaging device shown in FIG. 4.
Figure 5B:
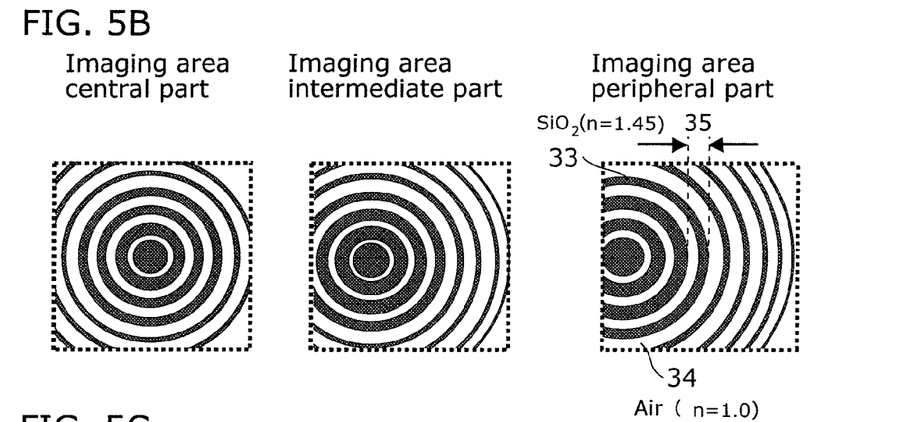
FIG. 5B is an exemplary top view of a light-collecting element in the unit pixel in each part of the imaging area in the conventional solid-state imaging device.
Figure 5C:
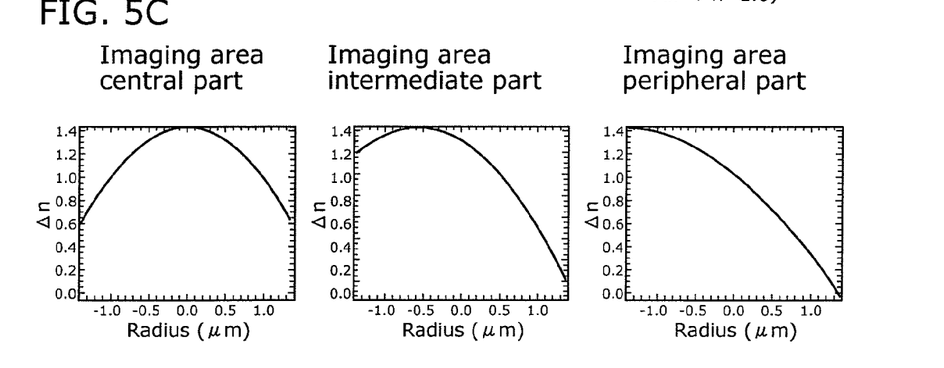
FIG. 5C is an exemplary graph showing a variation in effective refractive index of the light-collecting element in the unit pixel in each part of the imaging area in the conventional solid-state imaging device.

A solid-state imaging device 210 which employs the technique disclosed in Patent Reference 1 includes a gradient index lens having a different effective refractive index in each of an imaging area central part, an imaging area intermediate part (located between the center and the periphery), and an imaging area peripheral part, as shown in FIGS. 5A, 5B, and 5C. This being so, in the case where an imaging lens 220 for wide-angle incident light is used in a single-lens reflex digital camera 200 as shown in FIG. 4, even when light is obliquely incident on the imaging area peripheral part at a large angle with respect to the axis perpendicular to the incidence plane, the incident light can be collected at the light-receiving element 6. Hence a same level of sensitivity as in the imaging area central part can be achieved in the imaging area peripheral part.

Figure 6:
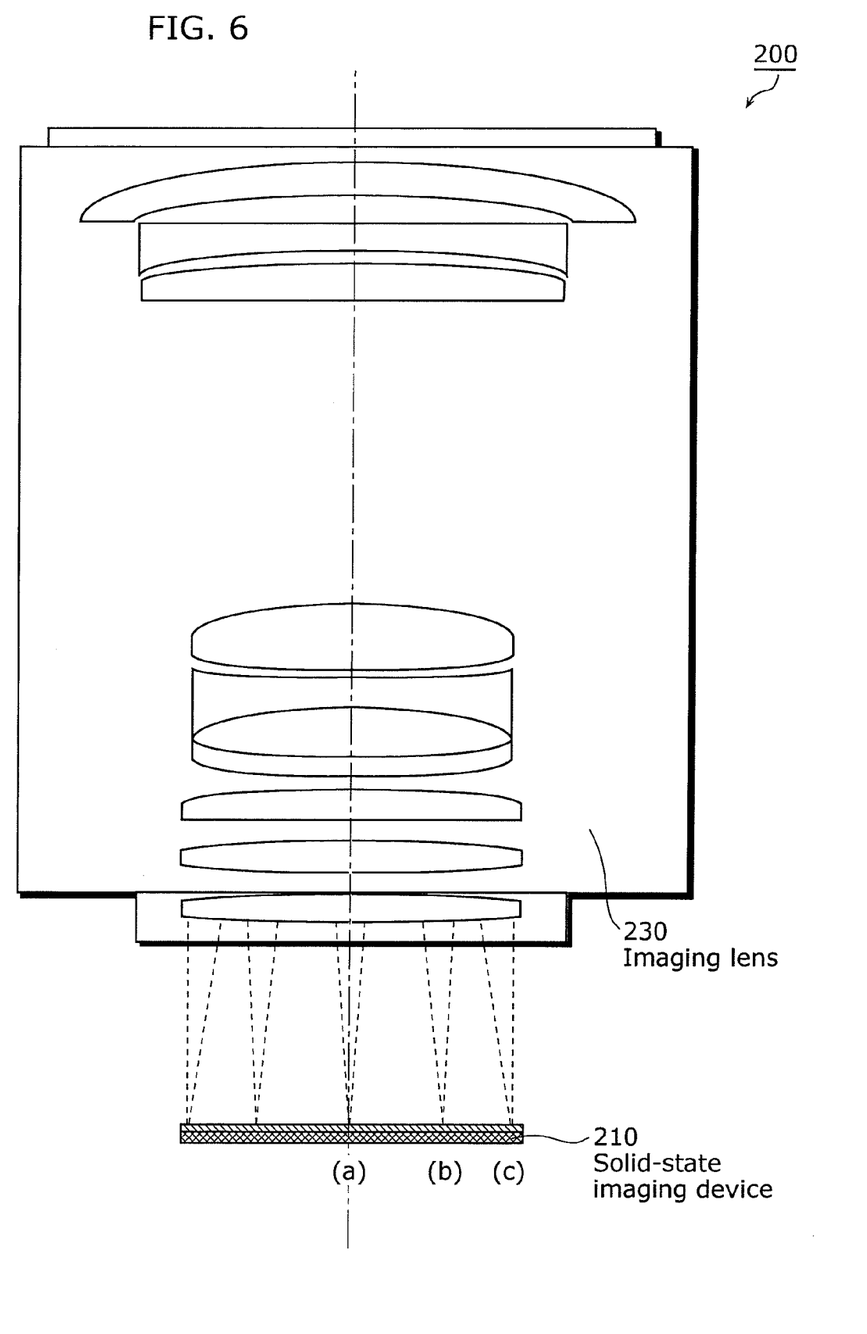
FIG. 6 shows a situation where light from an imaging lens is telecentrically (chief rays are approximately parallel to an optical axis) incident on the conventional solid-state imaging device.

However, the single-lens reflex digital camera 200 not only uses a lens for wide-angle incident light, but also uses an imaging lens 230 for light that is telecentrically (that is, chief rays are approximately parallel to an optical axis) incident on the solid-state imaging device 210 as shown in FIG. 6.

Figure 7A:
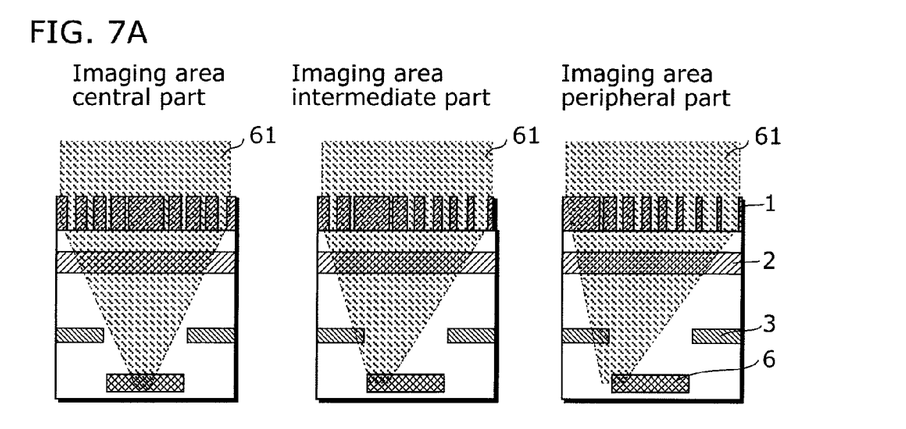
FIG. 7A is a sectional view showing an example of a basic structure of a unit pixel in each part of an imaging area in the conventional solid-state imaging device shown in FIG. 6.
Figure 7B:
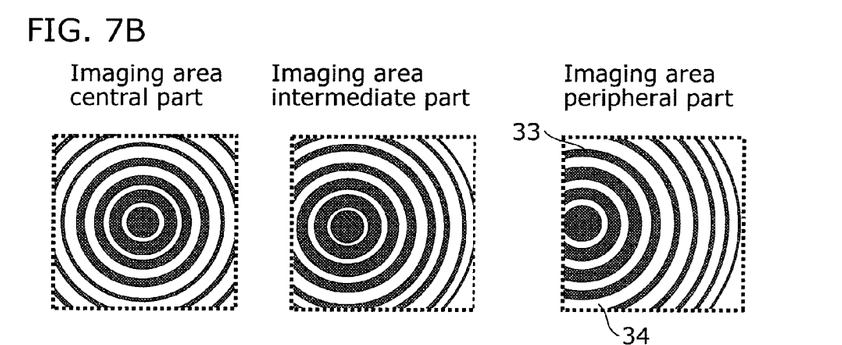
FIG. 7B is an exemplary top view of a light-collecting element in the unit pixel in each part of the imaging area in the conventional solid-state imaging device.
Figure 7C:
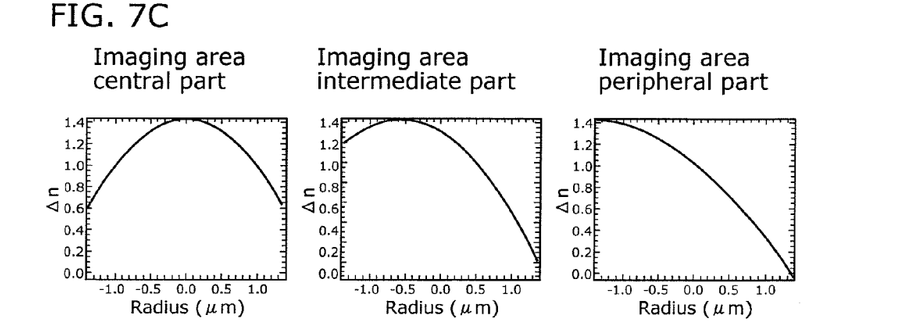
FIG. 7C is an exemplary graph showing a variation in effective refractive index of the light-collecting element in the unit pixel in each part of the imaging area in the conventional solid-state imaging device.

When light is telecentrically incident on the solid-state imaging device 210 which includes the gradient index lenses suitable for wide-angle incident light as shown in FIGS. 5A, 5B, and 5C, the light is bent more than necessary and as a result the amount of light reaching the light-receiving element 6 decreases in the imaging area peripheral part, as shown in FIGS. 7A, 7B, and 7C. This causes a peripheral part of an image to become dark.

In view of the above problems, the present invention has an object of providing a solid-state imaging device and the like that can capture an image which is bright through to its periphery, even when used in, for example, a single-lens reflex digital camera that accepts various interchangeable lenses from wide-angle to telephoto.

SUMMARY OF THE INVENTION

The solid-state imaging device according to the present invention is a solid-state imaging device including a two-dimensional array of unit pixels each of which includes a light-collecting element, wherein a light-collecting element in a unit pixel of the unit pixels is a combination of circular-sector-shaped light-collecting elements having different concentric structures, a central axis of the concentric structures being perpendicular to a light-receiving plane of the light-collecting element, and each of the circular-sector-shaped light-collecting elements is divided into concentric zone areas of a width equal to or smaller than a wavelength of incident light.

Thus, even when the light incident on the unit pixel changes from wide-angle to telecentric (chief rays are approximately parallel to an optical axis), an image which is bright through to its periphery can be captured.

Here, a light-collecting element in a unit pixel located in a peripheral part of the solid-state imaging device may be a combination of at least two circular-sector-shaped light-collecting elements having different concentric structures, wherein an effective refractive index distribution of the light-collecting element for incident light is asymmetrical about a first direction that is parallel to a light-receiving plane of the light-collecting element.

Here, a light-collecting element in a unit pixel located in the peripheral part of the solid-state imaging device may be a combination of at least two circular-sector-shaped light-collecting elements having different concentric structures, wherein an effective refractive index distribution of the light-collecting element for incident light is asymmetrical about a second direction that is parallel to a light-receiving plane of the light collecting element and is different from the first direction by 90°.

Here, a light-collecting element in a unit pixel located near any of four corners of the solid-state imaging device may be a combination of at least four circular-sector-shaped light-collecting elements having different concentric structures, wherein an effective refractive index distribution of the light-collecting element for incident light is asymmetrical about both a first direction that is parallel to a light-receiving plane of the light-collecting element and a second direction that is parallel to the light-receiving plane of the light-collecting element and is different from the first direction by 90°.

With the provision of the solid-state imaging device according to the present invention, even when the light incident on the unit pixel changes from wide-angle incidence to telecentric incidence (chief rays are approximately parallel to an optical axis), it is possible to prevent a periphery of a captured image from becoming dark.

FURTHER INFORMATION ABOUT TECHNICAL BACKGROUND TO THIS APPLICATION

The disclosure of Japanese Patent Application No. 2007-309448 filed on Nov. 29, 2007 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

An embodiment of the present invention is described in detail below, with reference to drawings. Though the present invention is described by way of the embodiment and attached drawings below, these are merely examples and the present invention should not be limited to such.

Figure 8A:
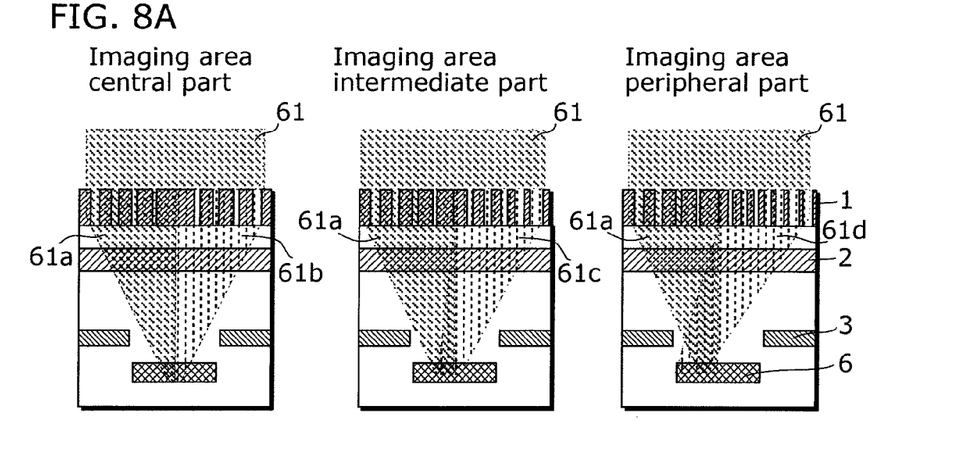
FIG. 8A is a sectional view showing an example of a basic structure of a unit pixel in each part of an imaging area in a solid-state imaging device according to an embodiment of the present invention, to illustrate a function of a light-collecting element for telecentric incident light.
Figure 8B:
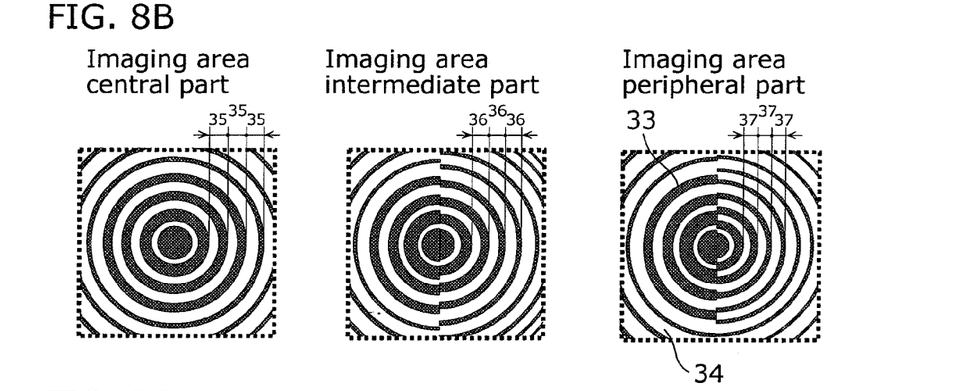
FIG. 8B is an exemplary top view of a light-collecting element in the unit pixel in each part of the imaging area in the solid-state imaging device according to the embodiment of the present invention.

FIG. 8A is a sectional view showing an example of a basic structure of a unit pixel in each part of an imaging area in a solid-state imaging device according to this embodiment. As shown in FIG. 8B, the solid-state imaging device according to the present invention is characterized in that: a light-collecting element 1 in a unit pixel other than a central part of the imaging area is a combination of circular-sector-shaped light-collecting elements having different concentric structures, a central axis of the concentric structures being perpendicular to a light-receiving plane of the light-collecting element 1; and each of the circular-sector-shaped light-collecting elements is divided into concentric zone areas of a width equal to or smaller than a wavelength of incident light.

As shown in FIG. 8A, in each of the imaging area central part, imaging area intermediate part, and imaging area peripheral part of the solid-state imaging device, a unit pixel (5.6 μm square in size) includes the light-collecting element 1 which is a gradient index lens, a color filter 2, an Al wiring layer 3, and a light-receiving element (Si photodiode) 6. A film thickness of the light-collecting element 1 is 1.2 μm. The following description mainly focuses on a structure different from the above conventional solid-state imaging device, with an explanation of a same structure as the conventional solid-state imaging device having been omitted.

FIG. 8B is an exemplary top view of the light-collecting element 1 in the unit pixel in each part of the imaging area (see FIG. 4) in the solid-state imaging device according to this embodiment. Each light-collecting element 1 shown in FIG. 8B has a concentric circle structure composed of $SiO_2$ (n=1.45) forming light-transmitting films 33 and air 34 (n=1.0). An outer radius difference 35 between adjacent light-transmitting films 33 of the light-collecting element 1 in the unit pixel in the imaging area central part is about 200 nm. On the other hand, the light-collecting element 1 in the unit pixel in each of the imaging area intermediate part and the imaging area peripheral part has a concentric circle structure that is asymmetrical about axis y passing through a center of the light-collecting element 1, and an outer radius difference 36 or 37 between adjacent light-transmitting films 33 is smaller than the outer radius difference 35, where 35>36>37. A doughnut-shaped area obtained by dividing the light-collecting element 1 by a width corresponding to an outer radius difference is hereafter referred to as a zone area.

Moreover, a line width of a light-transmitting film 33 is largest at a center of the concentric circle structure, and gradually decreases with a distance from the center. This being the case, when a width of a zone area is equal to or smaller than a wavelength of incident light, an effective refractive index for incident light can be calculated from a volume ratio between $SiO_2$ (n=1.45) forming the light-transmitting film 33 and the air 34 (n=1.0). Thus, in the solid-state imaging device according to the present invention, an effective refractive index distribution can be freely controlled simply by changing the line width of the concentric circle structure, that is, by changing the volume ratio between the light-transmitting film and the air.

Figure 8C:
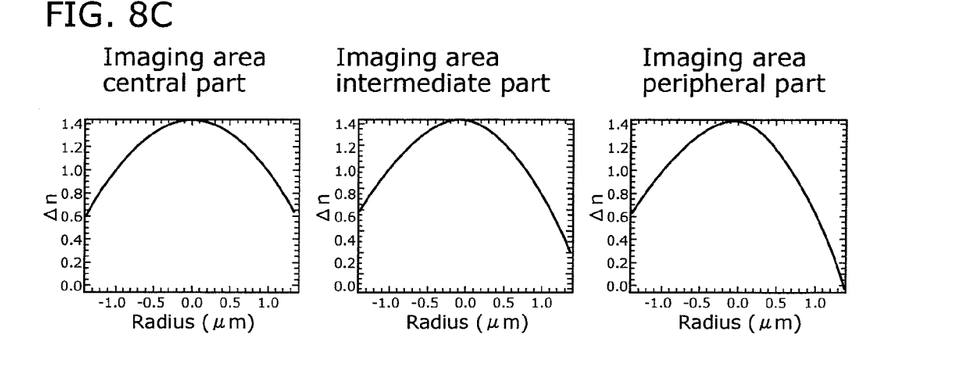
FIG. 8C is an exemplary graph showing a variation in effective refractive index of the light-collecting element in the unit pixel in each part of the imaging area in the solid-state imaging device according to the embodiment of the present invention.

FIG. 8C is an exemplary graph showing the effective refractive index of the light-collecting element 1 in the unit pixel in each part of the imaging area in the solid-state imaging device according to this embodiment.

For example, a parabola in the graph showing the effective refractive index of the light-collecting element 1 in the unit pixel in the imaging area central part shown in FIG. 8C indicates an effective refractive index distribution for collecting incident light with focal length f, and is defined by the following expression.

$$\Delta n(x) = \Delta n_{max}[(Ax^2 + Bx \sin\theta)/2n + C] \text{(where } A, B, \text{ and } C \text{ and constants.)} \quad (1)$$

$\Delta n_{max}$ is a refractive index difference (0.45 in this embodiment) between $SiO_2$ which is a light-transmitting film material and air.

When $n_0$ denotes a refractive index of an incidence-side medium and $n_1$ denotes a refractive index of an output-side medium, the parameters of the above expression (1) are as follows.

$$A = -(k_0 n_1)/2f \quad (1\text{-}1)$$

$$B = -k_0 n_0 \quad (1\text{-}2)$$

$$k_0 = 2\pi/\lambda \quad (1\text{-}3)$$

Thus, the lens can be optimized according to intended focal length f and the angle of incidence and wavelength of light that is to enter the lens. Note that, in the expression (1), a light collection component is represented by a quadratic function of distance x from the center to periphery of the unit pixel, and a deflection component is represented by a product of distance x and a trigonometric function.

As shown in FIG. 8C, the imaging area central part has an effective refractive index distribution that is symmetrical about the center of the unit pixel. Since the light incident on the imaging area central part is always parallel to the optical axis, the light-collecting element 1 in the imaging area central part is designed so that the light is collected symmetrically about the center of the light-receiving element as in the case of the conventional microlens.

On the other hand, as shown in FIG. 8A, in the light-collecting element 1 in the unit pixel located in the imaging area peripheral part (edge H in FIG. 11) as an example, telecentric (chief rays are approximately parallel to an optical axis) incident light is collected near an edge of the light-receiving element (that is, at a part of the light-receiving element closer to the center of the solid-state imaging device) by a light-collecting element of an inner half (left half in FIG. 8B) of the unit pixel and a light-collecting element of an outer half (right half in FIG. 8B) of the unit pixel. Which is to say, the light is collected in such a manner that the focus of each light-collecting element overlaps.

When lenses are exchanged, however, the angle of incidence of light changes in each of the imaging area intermediate part and the imaging area peripheral part according to a property of a newly mounted lens. Therefore, the light-collecting elements 1 in the imaging area intermediate part and the imaging area peripheral part are designed so that the effective refractive index distribution becomes more asymmetrical in a unit pixel closer to the imaging area peripheral part, thereby making the refractive angle of light in the outer half (right half in FIG. 9B) greater in the unit pixel closer to the imaging area peripheral part, as shown in FIG. 9A.

Figure 9A:
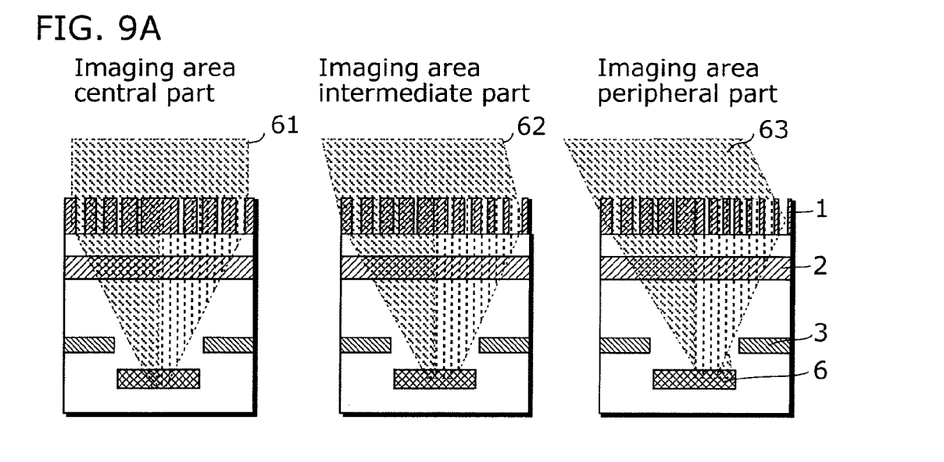
FIG. 9A is a sectional view showing an example of a basic structure of a unit pixel in each part of an imaging area in the solid-state imaging device according to the embodiment of the present invention, to illustrate a function of a light-collecting element for wide-angle incident light.
Figure 9B:
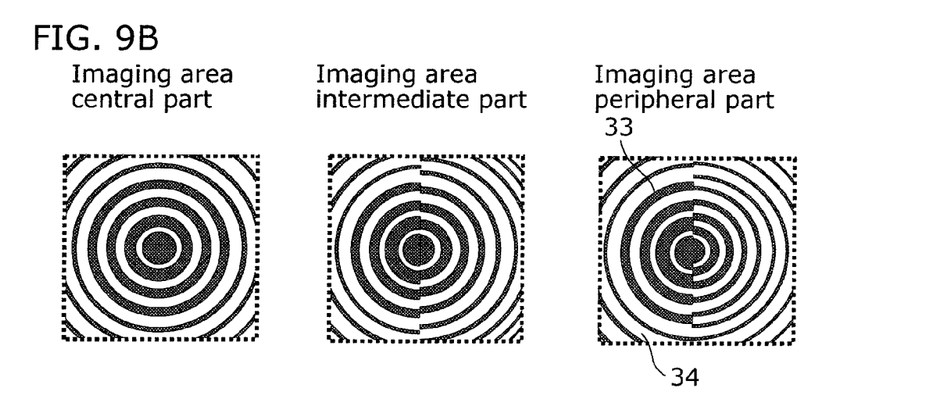
FIG. 9B is an exemplary top view of a light-collecting element in the unit pixel in each part of the imaging area in the solid-state imaging device according to the embodiment of the present invention.
Figure 9C:
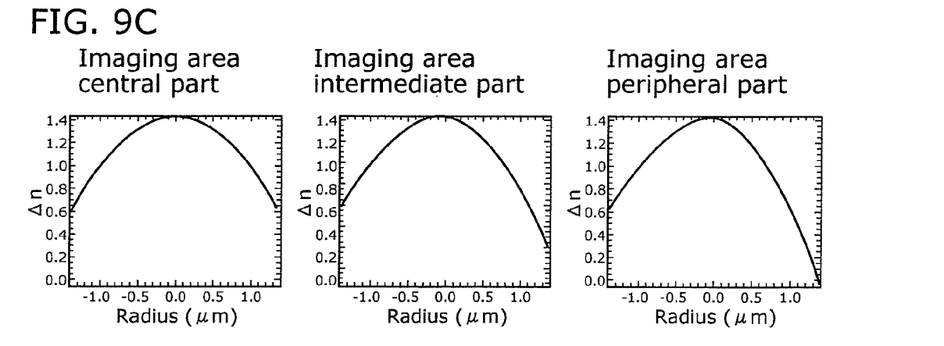
FIG. 9C is an exemplary graph showing a variation in effective refractive index of the light-collecting element in the unit pixel in each part of the imaging area in the solid-state imaging device according to the embodiment of the present invention.

For example, in the light-collecting element 1 in the unit pixel located in the imaging area peripheral part (edge H in FIG. 11) shown in FIG. 9A, wide-angle incident light is focused near an edge of the light-receiving element (that is, at a part of the light-receiving element closer to the periphery of the solid-state imaging device) by the light-collecting element of the inner half (left half in FIG. 9B) of the unit pixel and the light-collecting element of the outer half (right half in FIG. 9B) of the unit pixel.

Figure 10:
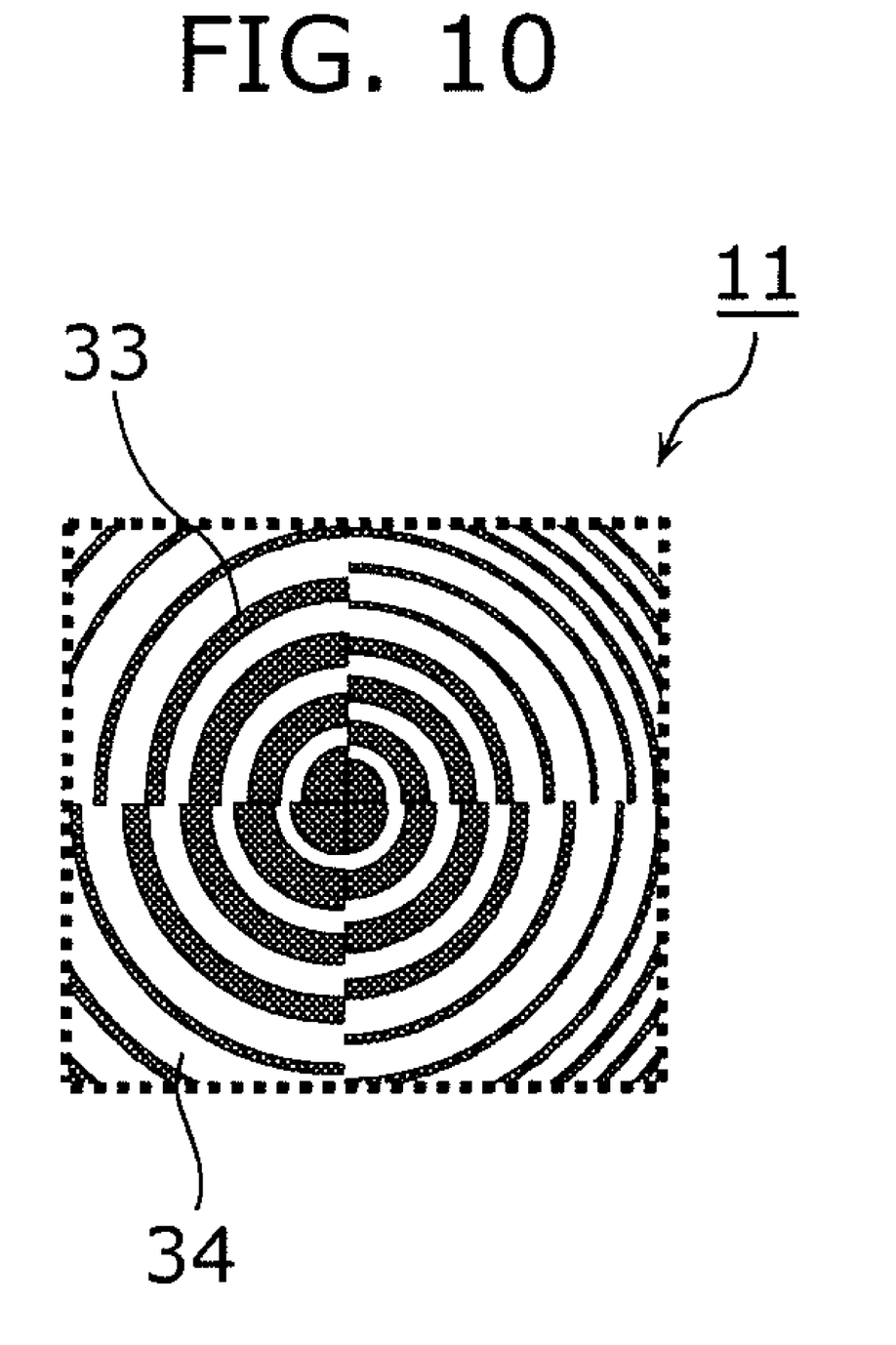
FIG. 10 is an exemplary top view of a light-collecting element at a corner (edge D) of the solid-state imaging device according to the embodiment of the present invention.

Furthermore, as shown in FIG. 10, a light-collecting element 11 in a unit pixel located in a part (edge D) corresponding to each of four corners of the imaging area (the solid-state imaging device) (see FIG. 11) is a combination of at least four light-collecting elements having different concentric structures. Here, an effective refractive index distribution for incident light is asymmetrical about axis x and axis y passing through a center of the unit pixel.

Figure 11:
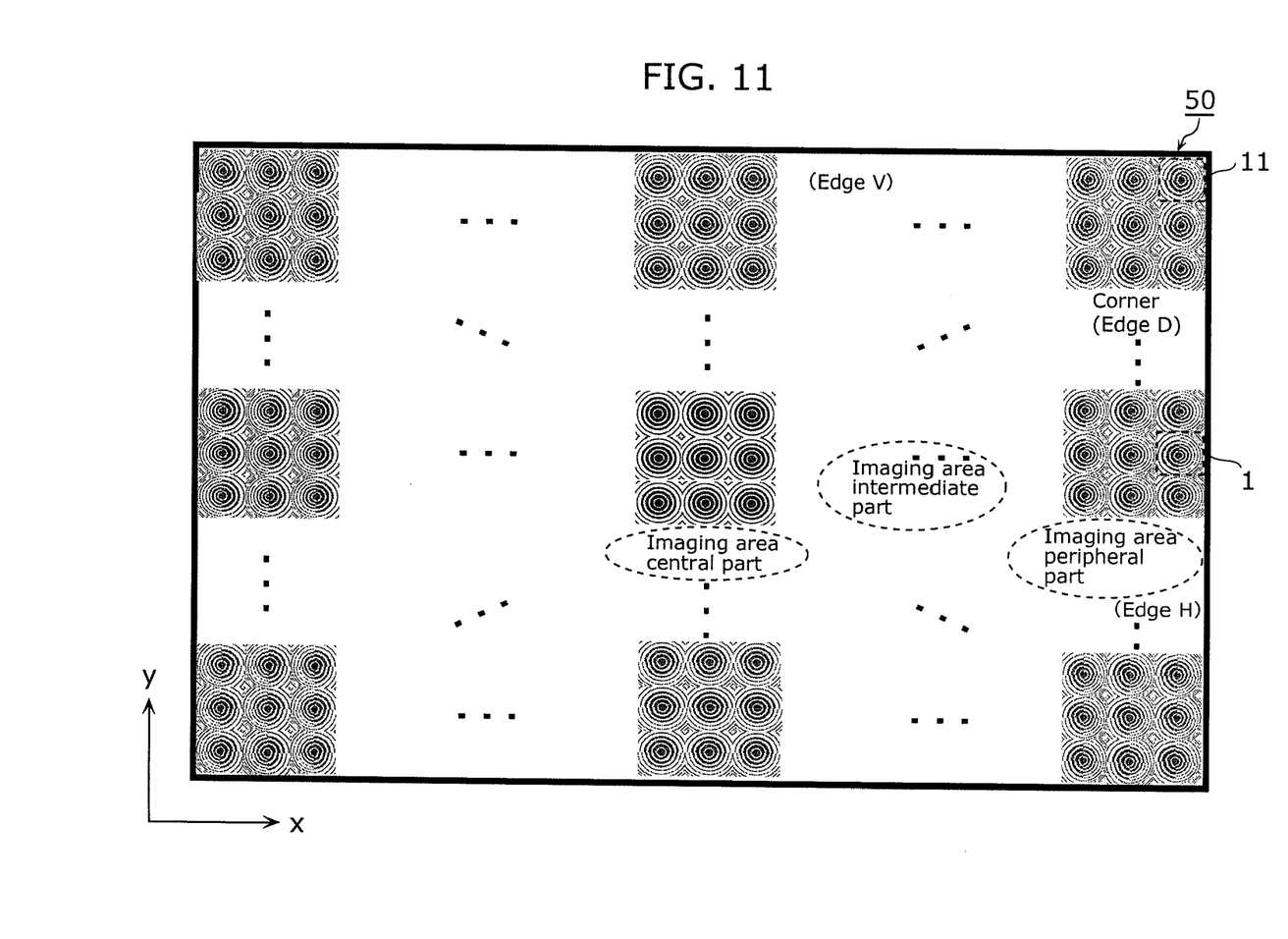
FIG. 11 shows an example of a layout of light-collecting elements in the imaging area in the solid-state imaging device according to the embodiment of the present invention.

FIG. 11 shows an example of a layout of unit pixels in the solid-state imaging device according to the present invention. The light-collecting element 1 that is asymmetrical about axis y is used in the imaging area peripheral part in the horizontal direction (direction of axis x) of the solid-state imaging device, while the light-collecting element 1 that is asymmetrical about axis x is used in the imaging area peripheral part in the vertical direction (direction of axis y) of the solid-state imaging device. Moreover, the light-collecting element 11 that is asymmetrical about both axis x and axis y shown in FIG. 10 is used in the part (edge D) corresponding to each of the four corners of the imaging area (the solid-state imaging device).

Figure 12:
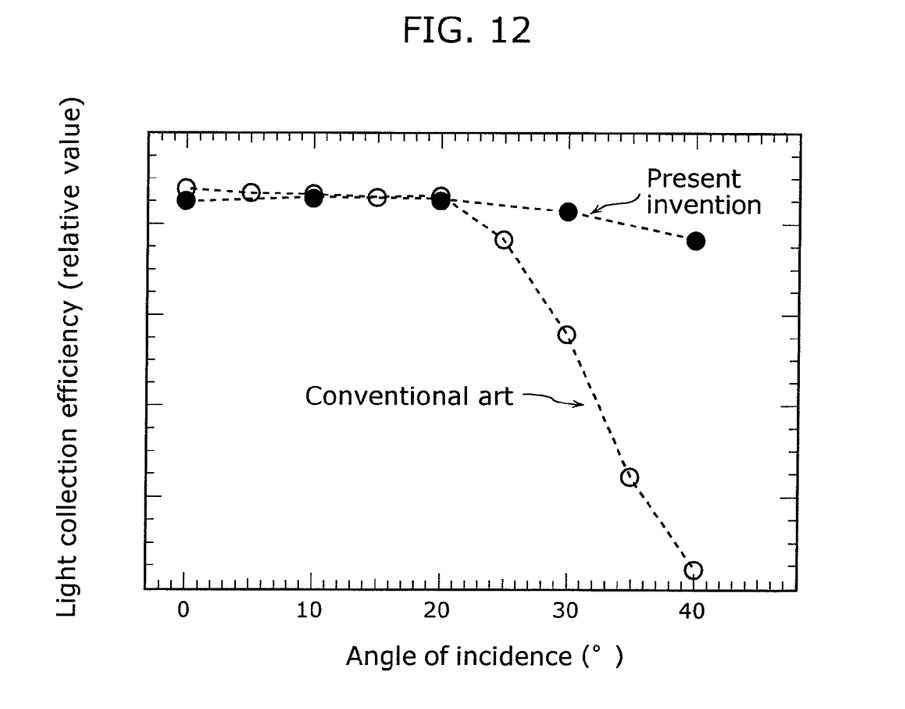
FIG. 12 shows angle-of-incidence dependence of light collection efficiency of the conventional solid-state imaging device and the solid-state imaging device according to the embodiment of the present invention.

According to this structure, even when light incident on a unit pixel changes from wide-angle to telecentric (chief rays are approximately parallel to an optical axis), the light collection efficiency characteristics of the solid-state imaging device are flat as shown by mark ● in FIG. 12, with it being possible to capture an image which is bright through to its periphery.

The above embodiment describes the case where the light-transmitting films of the light-collecting element form a concentric circle structure, but the present invention is not limited to the concentric circle structure. A concentric structure of a polygon such as a rectangle or a hexagon is equally applicable.

The above embodiment describes the case where the concentric circle structure of the light-collecting element in the unit pixel in each of the imaging area intermediate part and the imaging area peripheral part is asymmetrical about axis y passing through the center of the light-collecting element, but the concentric circle structure may instead be asymmetrical about axis x passing through the center of the light-collecting element.

The above embodiment describes the case where the outer radius differences 35 to 37 are such that 35>36>37. As an alternative, while setting the outer radius differences to be 35=36=37, the line widths of the light-transmitting films may be controlled to attain the same effective refractive index distributions as in the above case of 35>36>37.

The solid-state imaging device according to the present invention can be used for a digital still camera, a digital video camera, a camera-equipped mobile phone, and the like, and is therefore industrially useful.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A solid-state imaging device comprising
a two-dimensional array of unit pixels each of which includes a light-collecting element,
wherein a light-collecting element in a unit pixel of said unit pixels is a combination of circular-sector-shaped light-collecting elements having different concentric structures, a central axis of the concentric structures being perpendicular to a light-receiving plane of said light-collecting element, and
each of said circular-sector-shaped light-collecting elements is divided into concentric zone areas of a width equal to or smaller than a wavelength of incident light,
wherein said light-collecting element in a unit pixel located in a peripheral part of said solid-state imaging device is a combination of at least two of said circular-sector-shaped light-collecting elements having different concentric structures, and
an effective refractive index distribution of said light-collecting element for incident light is asymmetrical about a first direction that is parallel to a light-receiving plane of said light-collecting element.

2. The solid-state imaging device according to claim 1,
wherein said light-collecting element in a unit pixel located in the peripheral part of said solid-state imaging device is a combination of at least two of said circular-sector-shaped light-collecting elements having different concentric structures, and
an effective refractive index distribution of said light-collecting element for incident light is asymmetrical about a second direction that is parallel to a light-receiving plane of said light collecting element and is different from the first direction by 90°.

3. A solid-state imaging device comprising
a two-dimensional array of unit pixels each of which includes a light-collecting element,
wherein a light-collecting element in a unit pixel of said unit pixels is a combination of circular-sector-shaped light-collecting elements having different concentric structures, a central axis of the concentric structures being perpendicular to a light-receiving plane of said light-collecting element, and
each of said circular-sector-shaped light-collecting elements is divided into concentric zone areas of a width equal to or smaller than a wavelength of incident light,
wherein said light-collecting element in a unit pixel located near any of four corners of said solid-state imaging device is a combination of at least four of said circular-sector-shaped light-collecting elements having different concentric structures, and
an effective refractive index distribution of said light-collecting element for incident light is asymmetrical about both a first direction that is parallel to a light-receiving plane of said light-collecting element and a second direction that is parallel to the light-receiving plane of said light-collecting element and is different from the first direction by 90°.

* * * * *